(12) United States Patent
Hentges et al.

(10) Patent No.: US 7,089,647 B2
(45) Date of Patent: Aug. 15, 2006

(54) INCREASING THE COPPER TO SUPERCONDUCTOR RATIO OF A SUPERCONDUCTOR WIRE BY CLADDING WITH COPPER-BASED STRIP

(75) Inventors: Robert Hentges, Brick, NJ (US); Jeff Parrell, Roselle Park, NJ (US); William G. Marancik, Ebony, VA (US); Seung Hong, New Providence, NJ (US)

(73) Assignee: Oxford Superconducting Technology, Carteret, NJ (US)

( * ) Notice: Subject to any disclaimer, the term of this patent is extended or adjusted under 35 U.S.C. 154(b) by 201 days.

(21) Appl. No.: 10/782,408

(22) Filed: Feb. 19, 2004

(65) Prior Publication Data

US 2004/0226163 A1 Nov. 18, 2004

Related U.S. Application Data

(60) Provisional application No. 60/449,129, filed on Feb. 21, 2003.

(51) Int. Cl.
*H01L 39/24* (2006.01)

(52) U.S. Cl. .................. 29/599; 29/825; 174/125.1

(58) Field of Classification Search ............ 29/599, 29/825, 34 D; 174/125.1
See application file for complete search history.

(56) References Cited

U.S. PATENT DOCUMENTS

| | | | | |
|---|---|---|---|---|
| 3,472,944 A | * | 10/1969 | Barber et al. | 174/15.4 |
| 3,550,050 A | * | 12/1970 | Cord | 335/216 |
| 3,619,479 A | * | 11/1971 | Bogner | 174/125.1 |
| 3,662,093 A | * | 5/1972 | Wilson et al. | 174/125.1 |
| 3,710,000 A | * | 1/1973 | Shattes et al. | 174/125.1 |
| 3,767,842 A | * | 10/1973 | Bronca et al. | 174/128.1 |
| 3,800,414 A | * | 4/1974 | Shattes et al. | 29/599 |
| 3,876,473 A | * | 4/1975 | McDougall | 148/98 |
| 4,377,032 A | * | 3/1983 | Benz | 29/599 |
| 4,461,062 A | * | 7/1984 | Melzer et al. | 29/888.42 |
| 4,489,219 A | | 12/1984 | Suenaga et al. | |
| 5,223,349 A | | 6/1993 | Kudo | |

* cited by examiner

*Primary Examiner*—Carl J. Arbes
(74) *Attorney, Agent, or Firm*—Klauber & Jackson

(57) ABSTRACT

A method for increasing the copper to superconductor ratio of a superconductor core wire by forming a copper-based strip about the core wire which at least partially encloses the core wire in contact therewith by deforming the strip longitudinally into a U shape nested about the wire; and soldering the wire and strip in the assembly of step (a) to form a strong mechanical, electrical and thermal bond therebetween.

20 Claims, 2 Drawing Sheets

INCREASING THE COPPER TO SUPERCONDUCTOR RATIO OF A SUPERCONDUCTOR WIRE BY CLADDING WITH COPPER-BASED STRIP

RELATED APPLICATION

This application claims priority from U.S. provisional patent application Ser. No. 60/449,129 filed Feb. 21, 2003.

BACKGROUND OF THE INVENTION

Superconductor wire is commonly formed of one or more fine filaments of superconductor composition (e.g. NbTi or $Nb_3Sn$) which are embedded in a copper or copper-based matrix. A typical processing sequence for producing a NbTi multifilament conductor using a hex stack, starts with a can of copper which is fabricated by back extruding a copper pipe 12 inches in diameter and 36 inches long. A cone is fixed to one end and the interior of the can is filled with hexagonal rods. The rods are a composite with a round core of NbTi and a jacket of copper. The rods are assembled into the can in a hexagonal array to completely fill the interior with a minimum void volume. The spaces between the ID of the can and the hex stack, which are too small to accommodate a full hex, are filled with partial hexes of copper cut to fit the spaces.

A lid is pressed onto the can and the can is evacuated and welded by an electron beam welder. The can is then extruded from the 12 inch diameter to about 3 inches. The rod thus formed is over 40 ft long and is then drawn in steps of about 20% area reduction to final size. At various places during the drawing process, the rod/wire is heat treated to cause precipitation, which increases the current density of the final wire.

The hex composite rods are themselves fabricated by extrusion. Typically, an eight-inch billet of NbTi is inserted into a copper can that is sealed as above and extruded. The resultant rod is drawn and hexed at the desired size without any intermediate heat treatment.

An example of a typical process for the manufacture of a multifilamentary $Nb_3Sn$ conductor, begins with the drilling of a plurality of holes in a Cu/Sn bronze billet for the insertion of Nb rods. This billet is then extruded to a rod, which is then drawn down to fine wire. In some cases it is desirable that even more filaments be produced; this can be done by cutting the rod into a large number of equal lengths at some intermediate size, inserting these into an extrusion can, extruding this assembly and drawing the result to fine wire. The extrusion can in this case is either copper with a Nb or Ta barrier to prevent Sn diffusion, or bronze. The rod may be drawn through a hex-shaped die prior to cutting; if the rod is thus hexed, the lengths pack together in the extrusion can with less wasted space. In some cases it is desirable that there be provided a quantity of pure copper of good electrical conductivity. This may be done by lining a copper extrusion can with a layer of metal which (in the case of $Nb_3Sn$) is impermeable to tin, during high temperature heat-treatment, so that the tin does not diffuse into the copper and lower its conductivity; tantalum is the metal most commonly used. See, e.g., U.S. Pat. No. 3,996,661.

The copper to superconductor ratio of a superconductor wire (expressed as the ratio of area of copper to area of superconductor "Cu/SC" in a cross-section of the wire) is an important parameter related to stability. A quantity of a good electrical conductor in close proximity to the superconductive material is useful as an alternate current path or shunt in situations where it is likely that some fraction of the superconductive filaments will return to the normally-conducting state, which can happen, for example, in a rapidly-varying magnetic field. If in the initial phase of manufacture of the wire all of the required copper is included in the original billet, the cost of the process is very high. In addition, the processing becomes far more difficult if not impossible. To produce a superconductor with a large amount of copper is difficult because of the possibility of center burst. Center burst is the occurrence of broken filaments in the center of the composite. Center burst occurs during wire drawing if the ratio of soft matrix (copper) to hard filaments (e.g., NbTi or Nb) is too high. By maintaining this ratio low, i.e., by using a low amount of copper during the initial fabrication steps, one can avoid this problem. The alternative is to add additional copper at the final stages of fabrication. Various means have been devised to clad this additional copper in the final manufacturing step. These include:

a) Soldering the low copper-to-superconductor ratio round wire into a rectangular cross-section copper channel. For example, a superconductor wire (core wire) with a ratio of 1:1 copper to superconductor can be converted to a 8:1 ratio by soldering the core wire into a copper channel.
b) Hot cladding on a cladding line
c) Cladding on a tube mill
d) Cabling copper wire around a core wire of superconductor.

There are disadvantages to all of the above processes. Soldering into a rectangular channel limits applications to those requiring a conductor having a rectangular cross section. Hot cladding subjects the superconductor to very high temperature in order to create a metallurgical copper-to-copper bond. This bond is not always of the quality required and the high temperature may reduce the current density of the superconductor. The control of interface surface quality is not simple. Cladding on a tube mill with low temperature operation may not form a metallurgical bond between the copper tube clad over the superconductor core, and interface surface quality control can be quite difficult here also. Even with extensive redrawing, a true metallic bond is not formed and thus redrawing can subject the core to various problems such as center burst. Cabling usually requires soldering with the limitations listed above, as well as damage to the core wire if the cable is subjected to any reduction or shaping operations.

SUMMARY OF INVENTION

The present invention overcomes most of the problems indicated above. The invention in a presently preferred embodiment uses soldering to bond additional copper to a core wire to increase the copper to superconductor ratio. The preferred process uses round superconductor ("core") wire and flat copper strip (or a strip of a copper-based material such as a copper-nickel alloy) as input materials, and the outcome is still a round wire. The use of a solder bath also provides a cleaning action to the wire and strip, resulting in a high quality bond between the wire and strip.

The starting superconductor core wire subjected to the invention is manufactured with a low copper to superconductor ratio, such as 1:1 or even less. A spool of this wire and a spool of flat copper strip having appropriate dimensions are set up as the inputs to a solder cladding line. The input flat copper strip is deformed longitudinally into a "U", and it together with the superconductor wire are fed into a solder pot, passing through a series of successively smaller wire drawing dies which can be within or at the end of the molten solder bath. The process of drawing the superconductor and copper strip together in cooperation with the molten solder bath results in the tight wrapping of the copper strip around the superconductor wire, with the assembly being bonded together by solder. At the exit side of the processing line, a take up spool collects the product.

BRIEF DESCRIPTION OF DRAWINGS

The invention is diagrammatically illustrated by way of example, in the appended drawings, in which.

DESCRIPTION OF PREFERRED EMBODIMENT

Figure 1:
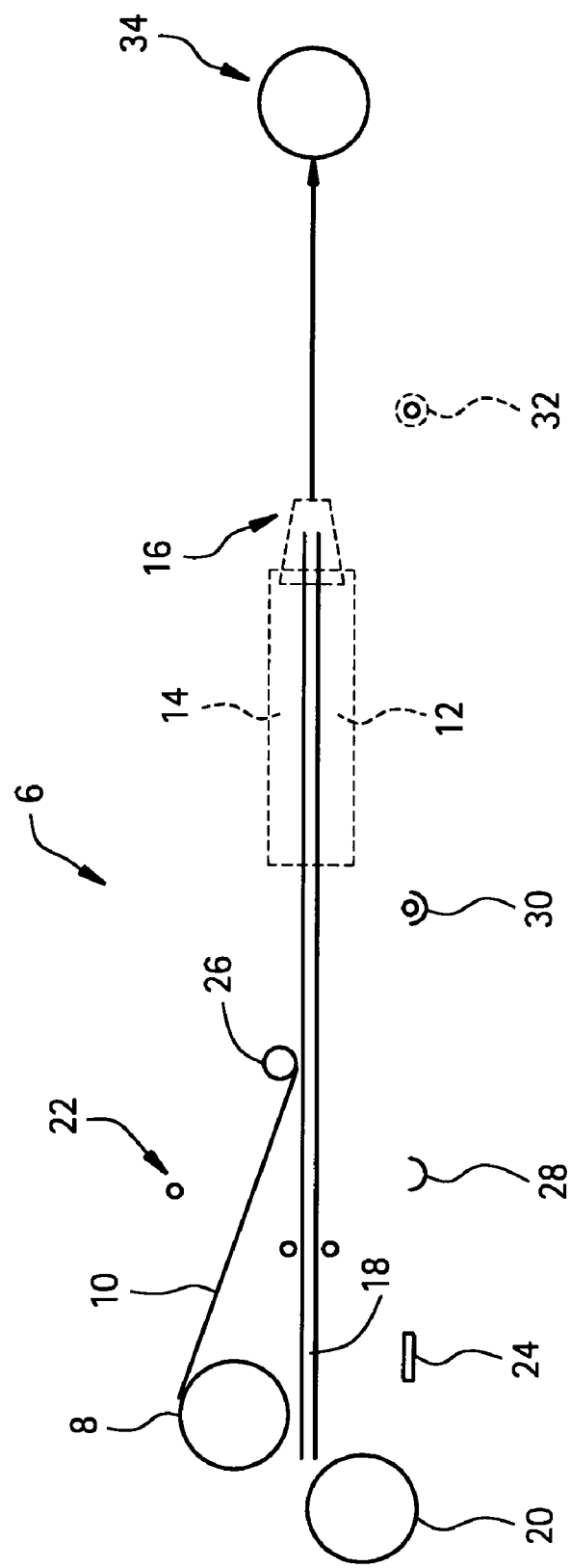
FIG. 1 is a schematic diagram depicting a typical method of practicing the present invention.
Figure 2:
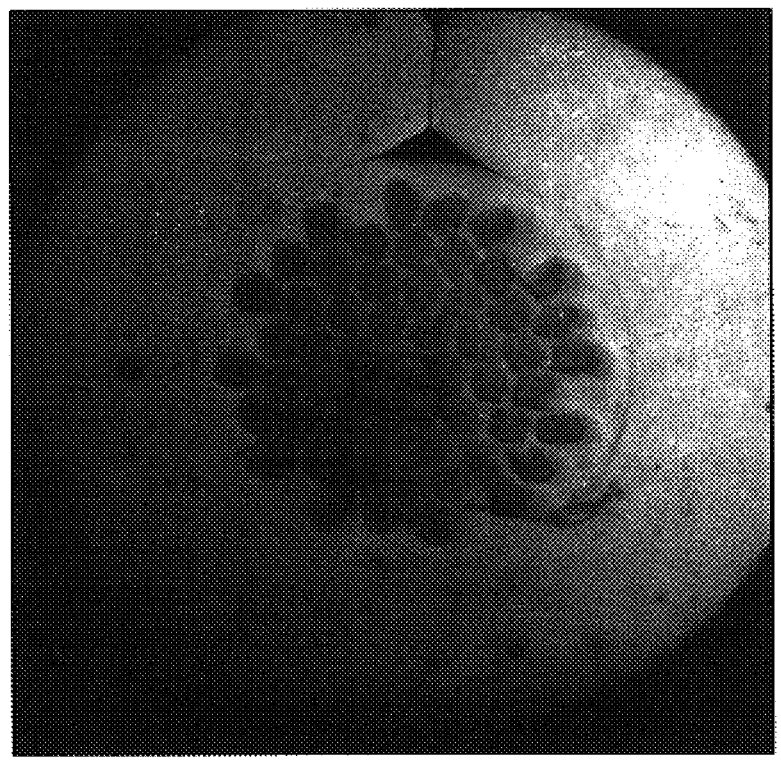
FIG. 2 is a photograph illustrating a transverse cross-section of a superconductor core wire which by practice of the invention has been wrapped with solder bonded copper strip.

In the schematic drawing of FIG. 1, it may be assumed as an example that in system 6 the input wire 10 to the solder bath 12 is a superconductor having a copper to superconductor ratio (Cu/SC) of 1:1. The wire 10 (herein called the "core" wire) is fed from a pay-off roll 8 and passes through a cladding system consisting of a wave solder pot 14 containing a system of guide wheels (not shown) and wire drawing dies (one of which is shown at 16) that serve to shape the copper strip 18 from pay off roll 20 around the round wire. The initial cross-sections of wire 10 and of strip 18 are respectively shown at 22 and 24. Forming rolls 26 initially deform strip 15 longitudinally into a "U" shape 28 which can nest about core wire 10 as shown at 30. The wire can be laid into the "U"-shaped strip in the solder bath or upstream of the solder bath with the further forming to more fully encase the wire in the copper strip being accomplished at or immediately following the solder bath while the solder is still at or above its melting point. The hot solder bath also facilitates the process by annealing the copper strip in situ to improve ease of shaping. By this process the superconductor wire becomes solder bonded to a wrapped strip of copper to produce a final conductor having a copper-to-superconductor ratio (in this Example) of 6:1. The cross section of wire leaving the die 16 (which as mentioned may be but one of a series of dies) is thus encased in the copper strip as shown in the cross section 32 (and also in the cross sectional photographs of FIG. 2). The product is provided to a take-up roll 34 where it is collected for further processing and/or use.

The core wire diameter entering the system 6 in this typical example is of 0.038" diameter and a copper strip having dimensions 0.02" thick×about 0.20" wide is wrapped around the superconductor core wire to produce a final diameter of 0.074". The wire entering has a Cu/SC ratio of 1:1 and exits the cladding line at 6:1. 1:1 Cu-to-superconductor ratio wire wrapped with a thinner gauge copper strip would result in a lower final copper to superconductor ratio. Most any ratio of Cu/Sc between 1:1 and 15:1 can be fabricated by appropriate selection of the initial wire diameter, initial copper to superconductor ratio, and the dimensions of the copper strip that becomes bonded to the superconductor.

The solder bath 12 performs several useful functions in this invention. The solder cleans the surfaces of the input wire and strip, which results in a high quality, clean interface between the materials; the solder acts a lubricant to help the drawing of the wire and strip; the solder helps anneal the copper strip in-situ to make it softer and easier to shape around the wire; and finally, when solidified, the solder forms a strong mechanical, electrical, and thermal bond between the superconductor wire and copper strip cladding to make the wire behave as a single body.

A further manufacturing procedure which can be used in the invention is to first clad the core wire with solder by running the core wire through a molten solder bath or by electroplating the core wire with solder. The cladding strip is then wrapped around the core wire, the assembly heated to melt the solder, and while still hot the composite is drawn through a die (or dies) and finally quenched with water to solidify the solder bond. If the strip is also clad with solder before being joined to the core wire, no flux will be required.

The choice of manufacturing procedure depends on the details of the final configuration and size of the final conductor.

The versatility of the process allows the stocking of a single wire configuration. When required this wire can be quickly converted to the desired copper to superconductor ratio by wrapping with the appropriate size copper strip. In the past, wire of a specific Cu/Sc ratio would take many months to prepare but by using copper strip cladding this turn around time can be shortened to weeks. Manufacture of small quantities of specific wire was not in the past practical because of the cost. However, copper strip cladding in accordance with the invention can produce even small quantities of wire form stocked precursor wire economically.

The core wire can be either single or multifilament, (as in FIG. 2) and the core wire can be twisted prior to cladding copper strip or not.

The strip can be a composite to provide the soldered composite with additional desirable properties such as increased strength, increased modulus or even extended surfaces. This includes using strip with slots, so that the core wire can be in direct contact with the liquid helium. The strip can e.g., be a composite of copper and stainless steel, copper and molybdenum. The term "copper-based" is intended to encompass both copper and further composites such as these.

The strip can be of such a width that it only partially encompasses the core surface. The angle of coverage (by encasement) can be between 180 to less then 360 degrees, where full coverage is 360 degrees. This allows the use of a thicker strip to produce an equivalent Cu/SC ratio as that of a thinner strip. In addition, if only a moderate increase in Cu/SC is required a full wrap of copper may require too thin a strip to be practical.

In all of the foregoing solder bonding is utilized. However it is also possible to wrap a conductor without bonding to supply mechanical support. In this case, the cladding material can be preformed in a mill just prior to inserting the core conductor. This is done in a continuous operation where the mill forms the configuration of the cladding under size so as the core is inserted the sheath clings to the core. The resulting assembly has additional mechanical strength, as well as increased electrical and thermal stability.

The cladding strip can also be applied to the core wire in the braiding process. In this operation the thin cladding strip is formed around the core wire as it enters the region in the braiding machine where the braid forms around the wire. The sequence of operations is as follows.

1) The wire enters the braiding machine
2) The cladding strip is formed around the core wire. This can be either a longitudinal wrap or a spiral wrap. The wraps can overlap, butt or only partially cover the core wire depending upon the ultimate intended use for the wire.

3) The core wire with cladding then travels a very short distance to the braiding point. Here the braid is formed around the core wire and the reinforcing strip, securing the strip firmly to the core wire.

It is also possible to add a thin strengthening material strip backing if the conductor is a rectangular shape. If the conductor is rectangular in shape, it can be made stronger mechanically by adding a thin strip of stronger material with same width of conductor. In effect a laminate is formed. They can be joined by soldering or simply can be held with insulation.

While the present invention has been described in terms of specific embodiments thereof, it will be understood in view of the present disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

The invention claimed is:

1. A method for increasing the copper to superconductor ratio of a superconductor core wire comprising:
   (a) forming a copper-based strip about the core wire which at least partially encloses the core wire in contact therewith by deforming the strip longitudinally into a U shape nested about the wire; and
   (b) soldering the wire and strip assembly resulting from step (a) to enable a strong mechanical, electrical and thermal bond therebetween by passing the said assembly through a molten solder bath.

2. A method in accordance with claim 1, further including a step of
   (c) solidifying the bond between said strip and wire by cooling the assembly.

3. A method in accordance with claim 2, wherein prior to step (c) said copper-based strip is further shaped about the core wire.

4. A method in accordance with claim 3, wherein the core wire is encased by the copper-based strip for from 180° to 360° of its cross-sectional circumference.

5. A method in accordance with claim 3 wherein step (b) and said further shaping are at least partially conducted simultaneously.

6. A method in accordance with claim 3, wherein said further shaping step is conducted subsequent to the assembly being passed through said molten solder but while the product is still at a temperature above the melting point of the solder.

7. A method in accordance with claim 3, wherein the wire and copper strip are each fed from continuous rolls of wire and strip and passed together through a forming roll which carries out step (a).

8. A method in accordance with claim 1, wherein said copper-based strip is joined to one or more backing strips of other metals to increase the strength of the resulting laminate.

9. A method for increasing the copper to superconductor ratio of a superconductor core wire and the mechanical strength thereof, comprising forming a copper-based strip about the core wire, to at least partially enclose the core wire in contact therewith and to form said strong mechanical assembly with increased copper to superconductor ratio.

10. A method in accordance with claim 9, wherein the copper-based strip is longitudinally deformed into an encasing enclosure for said core wire, and said core wire is subsequently inserted along the longitudinal axis of the enclosure.

11. A method in accordance with claim 10, wherein the encasing enclosure surrounds the core wire for from about 180° to 360° of the core wire cross-sectional circumference.

12. A method for increasing the copper to superconductor ratio of a superconductor core wire comprising:
   (a) forming a copper-based strip about the core wire which at least partially encloses the core wire in contact therewith by deforming the strip longitudinally into a U shape nested about the wire;
   (b) soldering the wire and strip in the assembly of step (a) to enable a strong mechanical, electrical and thermal bond therebetween by passing the assembly through a molten solder bath;
   (c) solidifying the bond between said strip and wire by cooling the assembly; and
   (d) wherein prior to step (c) said copper-based strip is further shaped about the core wire, said further shaping step being conducted subsequent to the assembly being passed through said molten solder but while the product is still at a temperature above the melting point of the solder.

13. A method for increasing the copper to superconductor ratio of a superconductor core wire comprising:
   (a) forming a copper-based strip about the core wire which at least partially encloses the core wire in contact therewith by feeding each of the wire and copper strip from continuous rolls of wire and strip, and feeding the said wire and strip together through a forming roll to deform the strip longitudinally into a U shape nested about the wire;
   (b) soldering the wire and strip in the assembly of step (a) to enable a strong mechanical, electrical and thermal bond therebetween by passing the assembly through a molten solder bath;
   (c) solidifying the bond between said strip and wire by cooling the assembly; and
   (d) wherein prior to step (c) said copper-based strip is further shaped about the core wire.

14. A method for increasing the copper to superconductor ratio of a superconductor core wire comprising:
   (a) forming a copper-based strip about the core wire which at least partially encloses the core wire in contact therewith by deforming the strip longitudinally into a U shape nested about the wire; and
   (b) soldering the wire and strip in the assembly of step (a) to enable a strong mechanical, electrical and thermal bond therebetween; and
   (c) wherein solder is applied to said core wire prior to step (a), wherein the assembly subsequent to step (a) is heated to a temperature above the melting point of said solder, and the bond between said strip and core wire is effected by subsequently cooling the assembly below the melting point of the solder; solidifying the bond between said strip and wire by cooling the assembly.

15. A method in accordance with claim 14 wherein subsequent to said heating and prior to said solder solidifying, said copper-based strip is further shaped about the core wire.

16. A method in accordance with claim 15, wherein in said further shaping about said core wire, the said wire is encased by the copper-based strip for from 180° to 360° of its cross-sectional circumference.

17. A method for increasing the copper to superconductor ratio of a superconductor core wire comprising:

(a) forming a copper-based strip about the core wire which at least partially encloses the core wire in contact therewith by deforming the strip longitudinally into a U shape nested about the wire;

(b) soldering the wire and strip in the assembly of step (a) to enable a strong mechanical, electrical and thermal bond therebetween by passing the assembly through a molten solder bath; and wherein said copper-based strip is joined to one or more backing strips of other metals to increase the strength of the resulting laminate.

18. A method for increasing the copper to superconductor ratio of a superconductor core wire comprising:

(a) forming a copper-based strip about the core wire which at least partially encloses the core wire in contact therewith by deforming the strip longitudinally into a U shape nested about the wire;

(b) soldering the wire and strip assembly resulting from step (a) to enable a strong mechanical, electrical and thermal bond therebetween; and (c) solidifying the bond between said strip and wire by cooling the assembly;

wherein solder is applied to said core wire prior to step (a), wherein the assembly subsequent to step (a) is heated to a temperature above the melting point of said solder, and the bond between said strip and core wire is effected by subsequently cooling the assembly below the melting point of the solder.

19. A method in accordance with claim 18 wherein subsequent to said heating and prior to said solder solidifying, said copper-based strip is further shaped about the core wire.

20. A method in accordance with claim 19, wherein in said further shaping about said core wire, the said wire is encased by the copper-based strip for from 180° to 360° of its cross-sectional circumference.

* * * * *